United States Patent [19]

Keeling et al.

[11] 4,227,298
[45] Oct. 14, 1980

[54] METHOD FOR INTERCONNECTING PHOTOVOLTAIC DEVICES

[75] Inventors: Michael C. Keeling, Tempe; William L. Bailey, Scottsdale; Michael G. Coleman, Tempe; Israel A. Lesk, Scottsdale; Robert A. Pryor, Phoenix, all of Ariz.

[73] Assignee: Motorola, Inc., Schaumburg, Ill.

[21] Appl. No.: 939,650

[22] Filed: Sep. 5, 1978

Related U.S. Application Data

[62] Division of Ser. No. 807,462, Jun. 17, 1977, Pat. No. 4,131,755.

[51] Int. Cl.² .................. H01R 43/00; H01R 43/04
[52] U.S. Cl. .................................. 29/837; 174/68.5; 357/65; 357/68; 206/329; 206/487
[58] Field of Search ............... 29/625, 628, 626, 624, 29/572; 174/68.5; 339/18 C; 136/89 R; 357/68, 65; 206/482, 487, 329, 334

[56] References Cited

U.S. PATENT DOCUMENTS

| | | | |
|---|---|---|---|
| 3,142,783 | 7/1964 | Warren | 174/68.5 X |
| 3,256,589 | 6/1966 | Warren | 29/624 |
| 3,356,786 | 12/1967 | Helms | 29/625 X |
| 3,553,030 | 1/1971 | Lebrun | 357/65 X |
| 3,575,721 | 4/1971 | Mann | 357/68 X |
| 3,601,753 | 8/1971 | Uberbacher | 339/18 C |
| 3,769,091 | 10/1973 | Leinkram et al. | 29/572 X |
| 3,973,996 | 8/1976 | Kennedy | 136/89 P X |

*Primary Examiner*—Francis S. Husar
*Assistant Examiner*—C. J. Arbes
*Attorney, Agent, or Firm*—John A. Fisher

[57] ABSTRACT

An interconnection system for interconnecting a plurality of photovoltaic devices. The photovoltaic devices each have a first and a second side and the interconnect system is located on the second side of the photovoltaic devices. A sheet of dielectric material and a sheet of electrically conductive material are bonded together and positioned so that the dielectric material is next to the photovoltaic devices. A plurality of patterns are formed in the sheet of electrically conductive material. The patterns each have angled tabs punched therein so that the angled tabs are punched through both the electrically conductive material and the dielectric material. When a photovoltaic device is positioned within a group of angled tabs, the angled tabs can be brought into contact with electrical contacts on the first side of the photovoltaic device. The group of angled tabs are electrically common to a part of the pattern which has an extended portion which extends beneath an adjacent photovoltaic device. Some of the dielectric material is removed from the extended portion so that this portion then makes contact with the second side of an adjacent photovoltaic device. The patterns can be formed in predetermined configurations to provide series or series-parallel interconnections for photovoltaic devices whithin an array of photovoltaic devices. The interconnect system, in turn, provides for substantially all possible series, parallel, or series-parallel interconnections of a plurality of arrays.

11 Claims, 7 Drawing Figures

METHOD FOR INTERCONNECTING PHOTOVOLTAIC DEVICES

This is a division, of application Ser. No. 807,462 filed June 17, 1977 U.S. Pat. No. 4,131,755.

CROSS REFERENCE TO RELATED APPLICATION

A related application is Ser. No. 646,733, filed Jan. 5, 1976, of Michael G. Coleman and Robert A. Pryor, and assigned to the assignee of the present invention.

BACKGROUND OF THE INVENTION

This invention relates, in general, to interconnection systems for electrically interconnecting a plurality of devices. More particularly, the invention relates to a method for interconnecting individual photovoltaic devices in an array.

Photovoltaic devices for converting radiant into electric energy are well known. The most common photovoltaic device is the semiconductor PN junction solar cell. Generally speaking, a single photovoltaic device does not provide sufficient electric voltage or current to be useful in most applications. However, by interconnecting a plurality of photovoltaic devices in series the voltage generated is higher than that generated by a single photovoltaic device. Similarly, connecting a plurality of photovoltaic devices in parallel increases the overall generated electric current; and, of course, the individual photovoltaic devices can be connected in a parallel-series configuration to generate a higher electrical voltage and current than does a single cell.

In the past, the most generally used interconnection scheme for interconnecting a plurality of photovoltaic devices was to use individual conductors which were bonded from one cell to the next. Elaborate fixtures were required to hold the photovoltaic devices in proper relationship with each other and the individual connectors. These fixtures were also necessary to reduce breakage during the bonding of the conductors. In addition, different fixtures were required for different configurations of the assembly. For instance, the same fixture could not be used for a series or a parallel interconnection of photovoltaic devices as was used for a series-parallel interconnection of devices. As a result, the cost of manufacturing equipment was increased and the time consumed in handling each individual conductor added to the cost of manufacture.

Accordingly, it is an object of the present invention to provide an improved method for interconnecting a plurality of photovoltaic devices to form a photovoltaic device array.

Another object of the present invention is to provide a method for interconnecting photovoltaic devices having stress relief in solder join connections.

A further object of the present invention is to provide an interconnection assembly which avoids handling individual conductors for interconnecting one photovoltaic device to other photovoltaic devices.

Still a further object of the present invention is to provide an improved method for interconnecting a plurality of photovoltaic devices into an array that greatly reduces the manufacturing labor.

Yet a further object of the present invention is to provide a method for interconnecting photovoltaic devices having enhanced inherent reliability and performance and which provides an unlimited number of parallel-series combinations of array interconnections.

SUMMARY OF THE INVENTION

In carrying out the above and other objects of the invention in one form there is provided an improved photovoltaic device array having a plurality of photovoltaic devices. The array is assembled by use of an improved interconnect system having a sheet of dielectric material and at least one sheet of electrically conductive material. The two sheets are bonded together to form a laminate. The sheet of electrically conductive material has patterns etched or otherwise formed in it. The patterns have tabs punched therein which are punched through both the electrically conductive material and the dielectric material. One end of each of the tabs is joined to the laminate. The patterns have an extended portion which extends away from the tabs. An area of the dielectric material, over the extended portions, is removed thereby exposing some of the electrically conductive material. Photovoltaic devices are placed on the laminate on the dielectric material side. A group of the punched tabs makes electrical contact with the top side of one of the photovoltaic devices while the exposed electrically conductive material makes contact with the bottom side of an adjacent photovoltaic device. The patterns can be arranged in a manner to provide series, parallel, or series-parallel interconnection of the photovoltaic devices in the array.

A method of interconnecting a plurality of photovoltaic devices by using a laminate of dielectric material and of electrically conductive material is also provided. First a plurality of patterns are configured in the electrically conductive material wherein the patterns have an extended portion. A void is provided in the dielectric material over the extended portions. A plurality of tabs are formed in each pattern by punching through the laminate. Photovoltaic devices are then placed upon the dielectric material with a photovoltaic device associated with each pattern so that the tabs can be pressed into contact with the upper side of the photovoltaic device. The tabs are bonded to the photovoltaic device while an adjacent photovoltaic device is bonded to the extended portion.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiments of the invention in one form thereof, and such exemplifications are not to be construed as limiting in any manner the scope of the invention.

DESCRIPTION OF THE PREFERRED EMBODIMENTS

Figure 1:
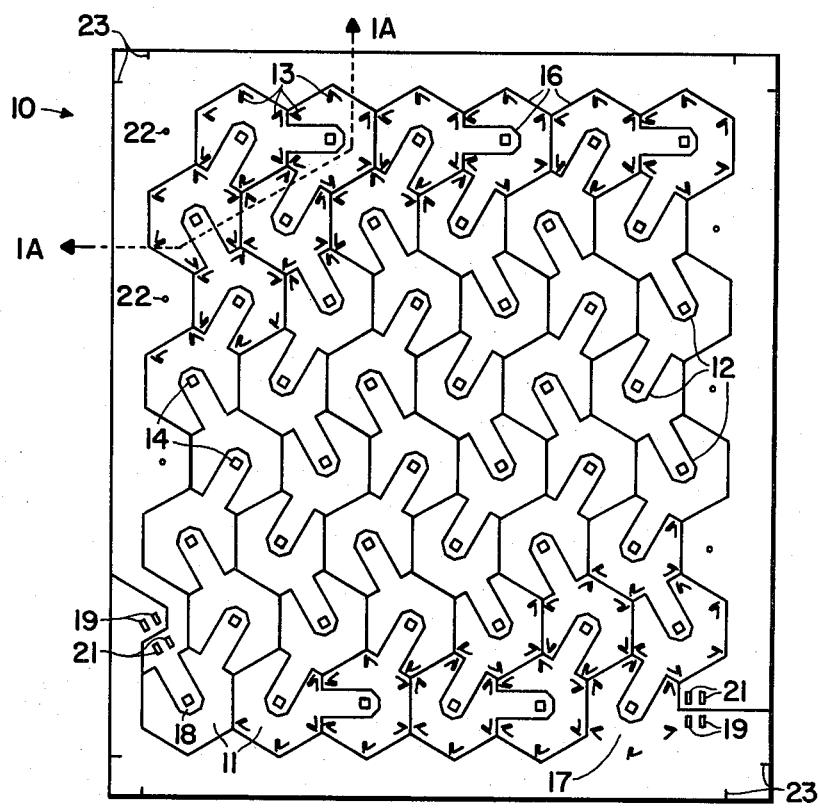
FIG. 1 illustrates an interconnection system employing the invention in one form thereof.

Referring first to FIG. 1, a plan view of an interconnecting system for circular photovoltaic devices is shown. The interconnection system 10 has a first or top sheet of dielectric material bonded to a sheet of electrically conductive material which is visible through the transparent dielectric material. The sheets of dielectric material and electrically conductive material form a laminate which is better shown in FIG. 3. The electrically conductive material can be of any material suitable for conducting electric current, such as copper, aluminum, etc. A plurality of patterns 11 are etched or otherwise formed in the electrically conductive material of FIG. 1 and each pattern 11 has an extended portion 12 which extends towards the central area of an adjacent pattern 11. The particular pattern configuration illustrated for interconnection system 10 will accommodate forty-eight circular photovoltaic devices. A plurality of angled tabs 13 are punched through the sheets forming the laminate. Tabs 13 form a pattern outlining the periphery of the photovoltaic devices that will be used with interconnection system 10. Some of the dielectric material is removed from the extended portion 12 thereby exposing an area 14 of electrically conductive material. All the lines 16 are preferably formed by etching and indicate a void of electrically conductive material.

As will be seen hereinafter, tabs 13 will be used to make electrical contact with the current carrying conductors of a photovoltaic device while the exposed area 14 of electrically conductive material in the extended portion 12 will make contact with the bottom of an adjacent photovoltaic device. It is preferred that the tabs 13 have an acute angle to provide for strain relief for cyclic stresses which can be thermally induced once the interconnection system is in an operational array and for mechanical stresses which can be induced during manufacture. A group 17 of tabs 13 are shown in the lower right hand corner of interconnect system 10. Although group 17 of angled tabs 13, does not have an extended portion 12, it is in electrical contact with electrical feedthroughs 19. Electrical feedthroughs 19 are electrically common with the connection for the topside of the photovoltaic device positioned in group or pattern 17. In the lower left hand corner there is shown an extended portion 18 which is electrically common to electrical feedthroughs 21 thereby providing an electrical feedthrough connection for the bottom sides of the photovoltaic devices. The pattern configuration illustrated in FIG. 1 provides for connecting forty-eight circular photovoltaic devices in series with each other. By having duplicate electrical feedthroughs 19 and 21 on each side of interconnection system 10 greater versatility in interfacing with interconnection system 10 is provided. Of course, it will be recognized that electrical feedthroughs can be positioned in other appropriate locations to accommodate yet other interface connections such as series, parallel, or series-parallel. Both sides of interconnecting system 10 have tooling alignment holes 22. The electrically conductive material surrounding the array of patterns 11 extends further than the array area in order to provide current carrying capabilities for the electrical feedthrough locations 19 and 21 from one side of the array to the other side. This excess material is intended to be folded under the array pattern area along fold lines determined by markers 23 so that when the interconnecting system 10 is assembled in a photovoltaic device array solar module border area is minimized. This additional current carrying capability eliminates the requirement of having to add external wires from one side of the array to the other.

Figure 1A:
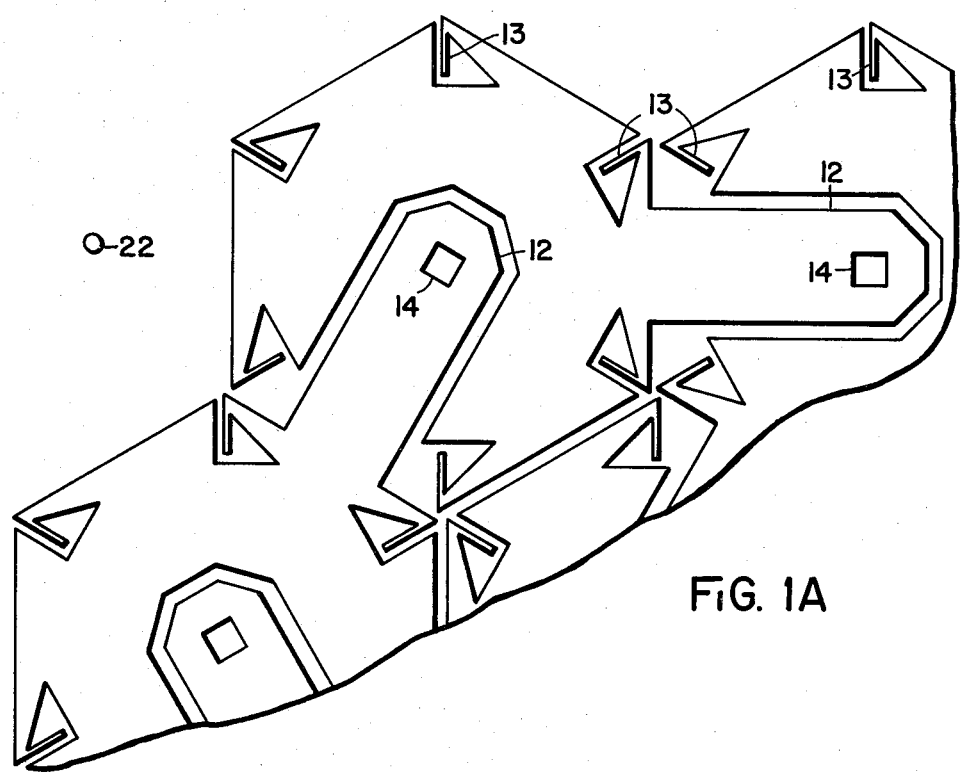
FIG. 1A is an enlarged view of a portion of the interconnection system of FIG. 1 and designated by the lines 1A—1A.

FIG. 1A illustrates in an enlarged view a portion of interconnect system 10 of FIG. 1. The acute angle of angled tabs 13 is better seen. Also, the electrical isolation between patterns, illustrated as lines 16 in FIG. 1, is better illustrated.

Figure 2:
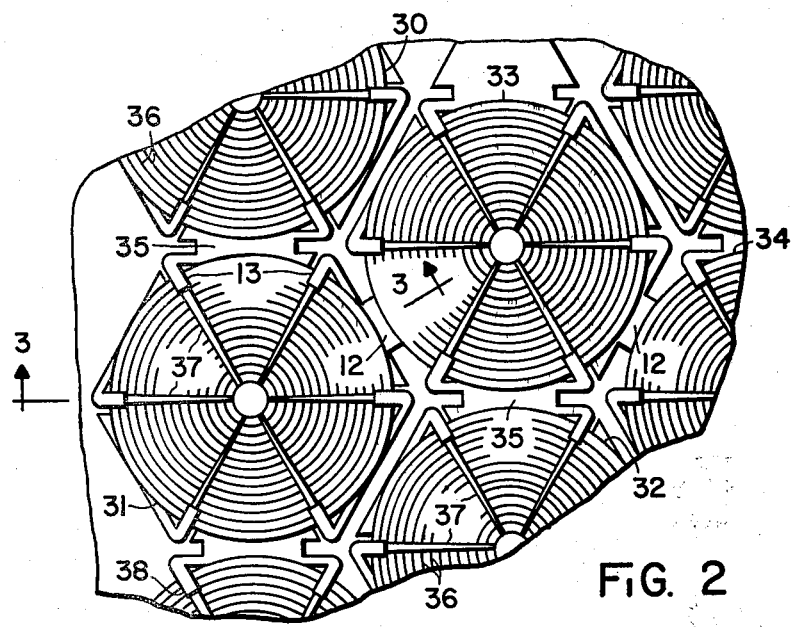
FIG. 2 is a plan view of a segment of a photovoltaic device array employing an interconnection system of the present invention.

A series-parallel interconnection of photovoltaic devices using an embodiment of the present invention is illustrated in FIG. 2. A segment of a photovoltaic device array is illustrated wherein photovoltaic devices 31 and 33 are shown in their entirety with phtovoltaic devices 30, 32, and 34 shown in part. The photovoltaic devices have a plurality of electrical conductors arranged in concentric circles 36. These electrical conductors serve as current collectors for the current generated by radiant energy impinging upon the photovoltaic device. Current collectors 36 are interconnected by conductors 37 which terminate at the periphery of the photovoltaic devices to form a contact 32 with angled tabs 13. Thus, current collected by current collectors 36 is conveyed from the photovoltaic device by conductors 37. Current collectors 36 and conductors 37 are deposited onto the photovoltaic devices. Each photovoltaic device interfaces with the interconnection system by way of six tabs 13. This provides for redundant connections to the photovoltaic device and increases the reliability of the array since the failure of one contact 38 will not significantly degrade the operation of the photovoltaic device array.

Photovoltaic devices 30 and 31 are connected in parallel with each other by way of connection 35 which connects the tabs 13 from device 30 to tabs 13 of device 31 thereby providing a common connection between the top sides of devices 30 and 31. Photovoltaic devices 32 and 33 are also connected in parallel in a similar manner. Device 31 is connected in series with device 33 which is also in series with device 34. This series connection is provided by extended portion 12 between photovoltaic device 31 and 33 and between device 33 and 34. Similarly, other devices in parallel with device 31 are in combination connected in series with other devices which are connected in parallel with device 33.

Figure 3:
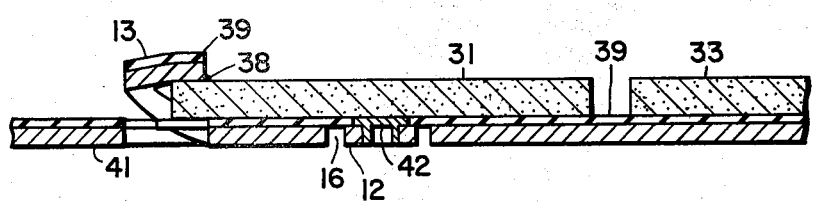
FIG. 3 is a sectional view of a portion of the array illustrated in FIG. 2.
Figure 4:
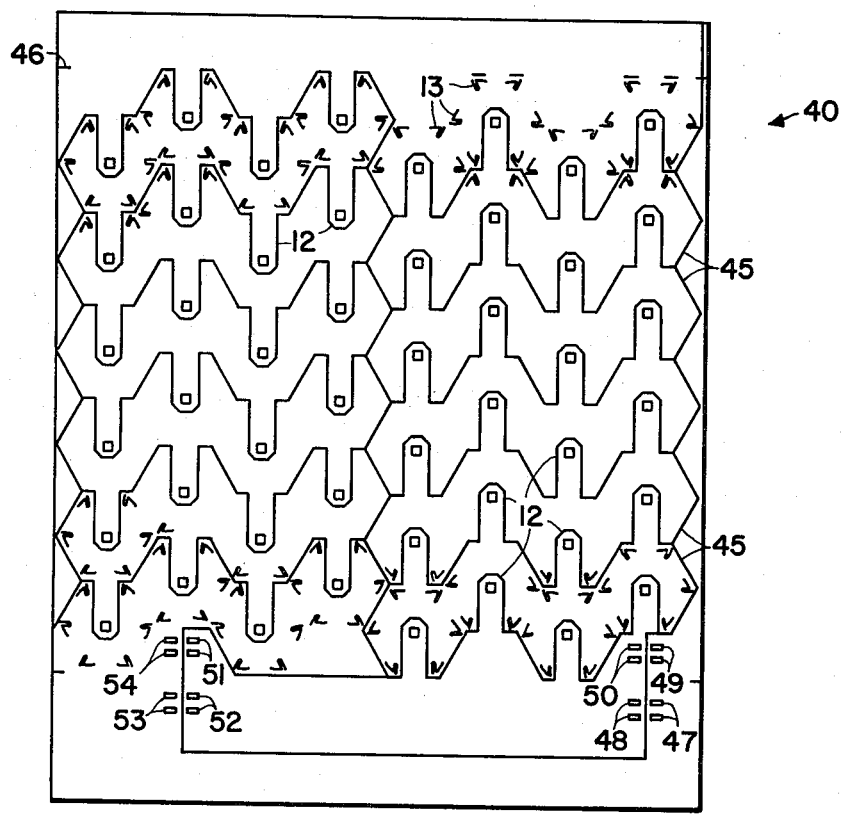
FIG. 4 is a plan view of an interconnection system illustrating another embodiment of the invention.

FIG. 3 is a cross-sectional view of a portion of a segment of FIG. 2 taken along the lines 3—3. This view better illustrates the laminate used in the interconnection system. The laminate is comprised of dielectric layer 39 and an electrically conductive layer 41. Angled tab 13 is shown attached to the top side of photovoltaic device 31 at contact 38. The bottom side of cell 31 is attached to electrically conductive sheet 41 by contact 42. Contact 42 can be any suitable electrically bonding material such as solder. An opening is made in dielectric material 39 to expose electrically conductive material 41 so that contact 42 may be achieved. It will be noted that in FIG. 3 contact 42 extends through electrically conductive material 41. It is not necessary for an opening to exist in material 41 to allow contact 42 to extend therethrough, however, the opening serves as an inspection hole to verify that soldered or bonded contact 42 was properly made. It will be noted that angled tab 13 is electrically in common with a portion of electrically conductive material 41 located underneath photovoltaic device 31 and is punched through both layers of the laminate. The loose end of angled tab 13 is on the dielectric side of the laminate. The photovoltaic device must be positioned so that its electrical conductors are beneath angled tabs 13. The angled tabs are then pressed down onto the electrical conductors and soldered. Tabs 13 help to maintain the photovoltaic devices spaced apart until the soldering is complete. The portion of material 41 containing contact 42 is electrically isolated from angled tab 13 by way of a void of material shown at 16 which is illustrated in FIG. 1 as line 16 and can better be seen in FIG. 1A. The isolated portion of material 41 containing contact 42 is an extended portion 12 of an adjacent pattern which is electrically common to angled tabs 13 connected to the top side of an adjacent photovoltaic device as illustrated in FIGS. 1 and 4. Dielectric material 39 can be any suitable material that is flexible and capable of withstanding the soldering temperature and which will keep leakage currents down in the order of microamps. Polyimide is a suitable dielectric material and can be purchased from Dupont under their trade name "KAPTON".

A series-parallel interconnection system 40 is illustrated in FIG. 4. This interconnection system 40 provides for connecting circular photovoltaic devices in parallel in groups of four and then serially connecting the groups with eleven other groups to provide four parallel by twelve series photovoltaic device to photovoltaic device connections. Patterns 45 each contain groups of tabs 13 arranged so that each group will receive one photovoltaic device. All the groups of tabs 13 within one pattern 45 are electrically common thereby providing for interconnecting the top sides of four photovoltaic devices. These photovoltaic devices are connected to the bottom side of adjacent photovoltaic devices by four extended portions 12. It again should be noted that each extended portion 12 has an opening in the dielectric material to expose the electrically conductive material beneath the dielectric. Eight electrical feedthroughs 47 through 54 provide means for interfacing electrically to the photovoltaic device array. Interconnect system 40 as illustrated in FIG. 4 will be folded along fold lines located by markers 46 prior to installation in a solar module. The fold will cause electrical feedthrough holes 47 and 48 to mate respectively with holes 49 and 50 while holes 52 and 53 will mate respectively with holes 51 and 54. Electrical feedthroughs 48, 50, 51, and 52 are all electrically common while feedthroughs 47, 49, 53, and 54 are electrically in common.

Figure 5:
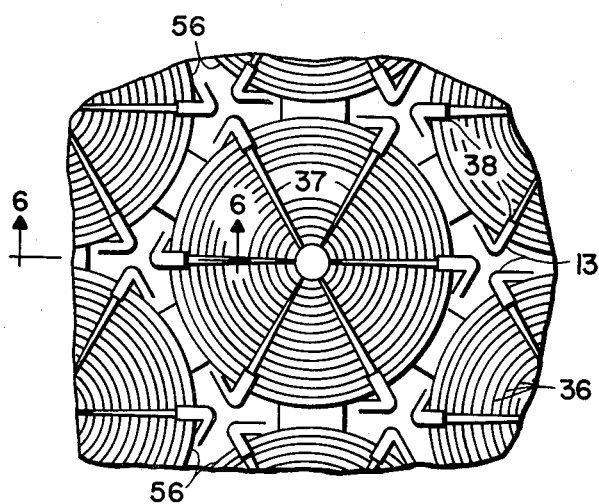
FIG. 5 is a plan view of a segment of a photovoltaic device array employing yet another embodiment of the invention.

In FIG. 5 there is illustrated a segment of a photovoltaic device array having a plurality of photovoltaic devices 56 which are all connected in parallel. Each photovoltaic device 56 has current collectors 36 arranged in concentric circles which are interconnected by conductors 37 which also provide an interface contact point 38 for each individual photovoltaic device. Photovoltaic devices 56 each have six tabs 13 making contact with the top side of the photovoltaic device. The interconnect system used for interconnecting photovoltaic devices 56 has a laminate comprising a sheet of dielectric material sandwiched between two sheets of electrically conductive material. This configuration is better illustrated in FIG. 6.

Figure 6:
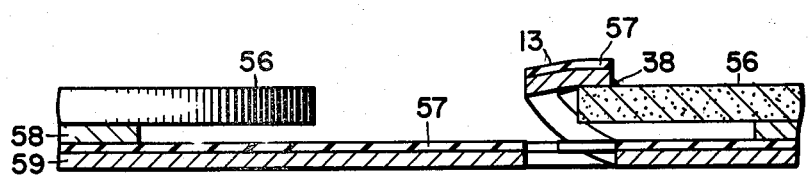
FIG. 6 is a sectional view of a portion of the array illustrated in FIG. 5.

A cross-sectional view of a portion of the segment illustrated in FIG. 5 is taken along lines 6—6 and illustrated in FIG. 6. A sheet of electrically conductive material 58 cooperates with a similar sheet 59 to sandwich dielectric material 57 therebetween. Electrically conductive material 58 is used for making electrical connections with the bottom portions of photovoltaic devices 56. Angled tabs 13 are punched from the laminate formed by materials 57, 58, and 59 and are raised upward and brought into contact with the topside of photovoltaic device 56 after device 56 is in position and tabs 13 are pressed down. Electrically conductive material 58 as illustrated in FIG. 6 has voids near and surrounding tabs 13 to avoid electrical shorts occurring between the material 59 and 58.

By now it should be appreciated that there has been provided a novel and improved interconnection system, for interconnecting a plurality of photovoltaic devices, which greatly reduces manufacturing costs associated with producing a solar module. The present invention takes the assembly operations from the individual photovoltaic device level to the total package level. The present invention is not only a practical approach but is accomplished with low-cost materials, minimum tooling, and yet includes the ability to reclaim the materials lost in the etching process particularly where copper is used as the electrically conductive material. More importantly, the present invention offers an inherently greater reliability due to the ease with which redundant contacts can be added and the strain relief provided by the angled tabs at essentially no extra cost.

The method of assembling a solar module employing the present invention includes etching or forming the desired patterns into the electrically conductive material of the laminate and then punching tabs from the laminate. The angled tabs remain attached at one end to the electrically conductive material with the loose ends being raised up so that photovoltaic devices can be accommodated in a skeleton outline formed by the tabs. When the tabs are pressed down they make contact with the top side of the photovoltaic device. It is preferred to etch the material prior to punching the tabs since the laminate will be more rigid and can therefore be easier held and supported prior to the punching. Once a laminate has been punched, the photovoltaic devices can be placed over the dielectric materials in conjunction with a group of tabs. Preferably the tabs and the contact areas for the bottom sides of the photovoltaic devices are solder tinned or a suitable base metal deposited prior to the placing of the photovoltaic devices on the laminate. Once the photovoltaic devices are in place all the individual device connections in the package can be made in one operation by oven solder reflowing. When the photovoltaic devices are in position the tabs assist in maintaining the devices in position. Solder joint stress relief is provided by the use of the acute angled tabs as well as flexible dielectric material and the electrically conductive material which is also flexible. This increases the reliability of the solar array module since thermal cycling fatigue is greatly reduced.

The use of the interconnect system with the photovoltaic devices as shown provides for a closely packed array that has a minimum of interstitial areas. The relatively wide metal conductors which skirt the perimeter of the patterns eliminates the need for additional wires and their connection points within a solar module array. In the past, many of the photovoltaic devices used were square of rectangular in configuration. However, such devices resulted in wasted silicon material. Typically, the silicon from which the semiconductor photovoltaic devices are made is grown in a circular rod configuration and then sliced to provide silicon wafers. If a square wafer is then made from the circular wafer it is apparent that considerable waste of silicon material results. The present invention permits the use of circular devices in closely packed arrays, thereby conserving silicon material and approaching the packing density permitted with square or rectangular photovoltaic devices. However, it should be recognized that the present invention can be used with any shape of photovoltaic device simply by punching the angled tabs in the proper configuration within each pattern. In addition, the patterns can be arranged so that they appear to be in elongated patterns arranged in an interdigitated or comb manner wherein one elongated pattern will make contact with one side of a plurality of photovoltaic devices while an adjacent elongated pattern will make contact with an opposite side of a plurality of photovoltaic devices.

While the present invention has been described with reference to particular preferred forms thereof in accordance with the Patent Statutes, it is to be understood that modifications may be made by those skilled in the art without actually departing from the invention. Therefore, it is intended in the appended claims to cover all such equivalent variations as come within the spirit and scope of the invention.

What is claimed as new and desired to secure by Letters Patent of the United States is:

1. A method of interconnecting a plurality of photovoltaic devices using a laminate of dielectric material and of electrically conductive material, comprising the steps of: configuring a plurality of patterns in the electrically conductive material, the patterns having an extended portion; providing a void in the dielectric material over the extended portion; punching a plurality of angled tabs in each pattern through the laminate, the extended portion and the angled tabs formed in a single plane; lifting upward the angled tabs so that photovoltaic devices can be placed on the dielectric material; placing photoelectric devices on the dielectric material; pressing the angled tabs toward the photovoltaic devices so that a portion of the angled tabs comes in contact with the photovoltaic device; bonding the angled tabs to the photovoltaic device; and bonding the extended portion to an adjacent photovoltaic device.

2. The method of claim 1 further including the step of tinning the angled tabs and an area of the electrically conductive material exposed by the void in the dielectric material prior to performing the bonding.

3. The method of claim 1 further including the step of configuring the plurality of patterns so that the patterns are electrically isolated from each other and the angled tabs have an acute angle.

4. The method of claim 1 further including the step of configuring the plurality of patterns in electrically isolated groups so that the photovoltaic devices can be interconnected in a series-parallel configuration.

5. A method for interconnecting a plurality of photovoltaic devices using a laminate of dielectric material and of electrically conductive material, comprising the steps of:

forming a plurality of patterns in the electrically conductive material, the patterns having an extended portion and a plurality of angled tabs;

providing a void in the dielectric material proximate the extended portion;

protruding the angled tabs through the dielectric material; bending the angled tabs upward so that photovoltaic devices can be placed on the dielectric material, the angled tabs positioned about the photovoltaic devices; placing photovoltaic devices on the dielectric material;

pressing the angled tabs toward the photovoltaic devices so that a portion of the angled tabs comes in contact with a photovoltaic device;

bonding the angled tabs to the photovoltaic devices; and bonding the extended portion to an adjacent photovoltaic device.

6. The method of claim 5 wherein the step of protruding comprises punching the angled tabs through the dielectric material.

7. The method of claim 5 wherein the steps of bonding comprise soldering.

8. A method of interconnecting an array of photovoltaic devices which have a first and a second side, the method comprising: punching a plurality of angled tabs through a laminated sheet of electrically conductive material and of dielectric material, the plurality of angled tabs substantially forming a skeleton outline of a photovoltaic device; forming predetermined patterns in the sheet of electrically conductive material laminated to a sheet of dielectric material, the patterns substantially surrounding groups of angled tabs and providing two conductive paths for contacting the first and second sides; removing a portion of the dielectric material associated with each pattern to expose a portion of electrically conductive material; preparing the angled tabs and areas of electrically conductive material exposed by removing a portion of the dielectric material for attachment to one of the photovoltaic devices; placing a photovoltaic device in each outline formed by the angled tabs; making electrical connections between the prepared angled tabs and the first side of the photovoltaic devices and the prepared area of electrically conductive material and the second sides of the photovoltaic device wherein the angled tabs of a pattern and associated areas of electrically conductive material are connected respectively to first and second sides of adjacent photovoltaic devices.

9. The method of claim 8 wherein solder tinning is used to prepare the angled tabs and areas of electrically conductive material.

10. A method of interconnecting an array of photovoltaic devices by using an electrical conductor/dielectric laminate wherein the photovoltaic devices have a first and a second side, the method comprising: punching groups of angled tabs from the conductor and dielectric laminate so that a portion of the angled tabs remain connected to the laminate, the angled tabs having an acute angle and the electrical conductor portion of the angled tabs extending through plane of the dielectric; etching patterns in the electrical conductor portion of the laminate so that the patterns incorporate groups of the angled tabs and form an extended portion associated with each group of angled tabs, the angled tabs and extended portion originally formed in a plane; removing an area of dielectric over the extended portion to expose an area of the electrical conductor; tinning the exposed area of electrical conductor and the angled tabs; positioning a photovoltaic device in each group of angled tabs so that at least a piece of the angled tab is on the first side of the photovoltaic device; and soldering the angled tabs to the first side of the photovoltaic device and soldering the second side of an adjacent photovoltaic device to the exposed area of electrical conductor so that the angled tabs of a group are connected to the first side of a photovoltaic device and the exposed area of the associated extended portion is connected to the second side of an adjacent photovoltaic device.

11. The method of claim 10 further including arranging the patterns with groups of angled tabs to provide a parallel-series interconnection for the array of photovoltaic devices.

* * * * *